United States Patent
Huang et al.

(10) Patent No.: US 9,209,048 B2
(45) Date of Patent: Dec. 8, 2015

(54) TWO STEP MOLDING GRINDING FOR PACKAGING APPLICATIONS

(71) Applicant: Taiwan Semiconductor Manufacturing Company, Ltd., Hsin-Chu (TW)

(72) Inventors: Wen-Chun Huang, Jhongli (TW); Chien-Chen Li, Hsin-Chu (TW); Kuo-Chio Liu, Hsin-Chu (TW); Ruey-Yun Shiue, Hsin-Chu (TW); Hsi-Kuei Cheng, Jhubei (TW); Chih-Hsien Lin, Tai-Chung (TW); Jing-Cheng Lin, Tung Zhen (TW); Hsiang-Tai Lu, Zhubei (TW); Tzi-Yi Shieh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/276,832

(22) Filed: May 13, 2014

(65) Prior Publication Data
US 2015/0187607 A1   Jul. 2, 2015

Related U.S. Application Data

(60) Provisional application No. 61/922,002, filed on Dec. 30, 2013.

(51) Int. Cl.
| | |
|---|---|
| *H01L 21/56* | (2006.01) |
| *H01L 23/28* | (2006.01) |
| *H01L 23/29* | (2006.01) |
| *H01L 23/31* | (2006.01) |
| *H01L 23/60* | (2006.01) |
| *H01L 25/065* | (2006.01) |

(52) U.S. Cl.
CPC .............. *H01L 21/565* (2013.01); *H01L 21/56* (2013.01); *H01L 21/561* (2013.01); *H01L 21/563* (2013.01); *H01L 23/28* (2013.01); *H01L 23/29* (2013.01); *H01L 23/31* (2013.01); *H01L 23/3107* (2013.01); *H01L 23/3114* (2013.01); *H01L 23/3135* (2013.01); *H01L 23/60* (2013.01); *H01L 25/0652* (2013.01)

(58) Field of Classification Search
CPC ..... H01L 21/56; H01L 21/561; H01L 21/563; H01L 21/565; H01L 23/28; H01L 23/31; H01L 23/3107; H01L 23/3114; H01L 23/3135
USPC .......... 438/112, 126, 127, 122; 257/787, 788, 257/796
See application file for complete search history.

(56) References Cited

U.S. PATENT DOCUMENTS

| | | | | |
|---|---|---|---|---|
| 2004/0053445 | A1* | 3/2004 | Briar et al. .................... | 438/108 |
| 2011/0193221 | A1* | 8/2011 | Hu et al. ........................ | 257/737 |
| 2011/0316146 | A1* | 12/2011 | Pagaila et al. ................. | 257/737 |
| 2012/0098123 | A1* | 4/2012 | Yu et al. ........................ | 257/737 |

(Continued)

*Primary Examiner* — Marvin Payen
*Assistant Examiner* — Jeremy Joy
(74) *Attorney, Agent, or Firm* — Slater & Matsil, L.L.P.

(57) ABSTRACT

Embodiments of the present disclosure include semiconductor packages and methods of forming the same. An embodiment is a method including mounting a die to a top surface of a substrate to form a device, encapsulating the die and top surface of the substrate in a mold compound, the mold compound having a first thickness over the die, and removing a portion, but not all, of the thickness of the mold compound over the die. The method further includes performing further processing on the device, and removing the remaining thickness of the mold compound over the die.

20 Claims, 10 Drawing Sheets

(56) References Cited

U.S. PATENT DOCUMENTS

| | | | |
|---|---|---|---|
| 2012/0119346 A1* | 5/2012 | Im et al. | 257/690 |
| 2013/0134559 A1* | 5/2013 | Lin et al. | 257/620 |
| 2013/0147054 A1* | 6/2013 | Lin et al. | 257/774 |
| 2013/0217188 A1* | 8/2013 | Wang et al. | 438/118 |

* cited by examiner

TWO STEP MOLDING GRINDING FOR PACKAGING APPLICATIONS

PRIORITY CLAIM

This application claims the benefit of U.S. Provisional Application Ser. No. 61/922,002, filed on Dec. 30, 2013, entitled "Two Step Molding Grinding for ESD Protection," which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the sub-20 nm node). As the demand for miniaturization, higher speed and greater bandwidth, as well as lower power consumption and latency has grown recently, there has grown a need for smaller and more creative packaging techniques of semiconductor dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to embodiments in a specific context, namely a Die-Interposer-Substrate stacked package using Chip-on-Wafer-on-Substrate (CoWoS) processing. Other embodiments may also be applied, however, to other packages, such as a Die-Die-Substrate stacked package, and other processing.

In general terms, embodiments of the present disclosure may provide for an improved approach to reduce or minimize or perhaps entirely eliminate electro-static discharge (ESD) events during a manufacturing process, such as, for example, a C4 (controlled collapse chip connection) manufacturing process. As such, the process windows for manufacturing CoWoS devices can be expanded, reducing manufacturing costs and complexity, while increasing process yield.

While static electricity cannot be totally eliminated in the manufacturing environment, its impact can be reduced. One approach, as described herein, is to maintain an isolation layer on a die (such as the backside of a die) during a C4 bump process. This may reduce or eliminate the path by which static electricity can reach and damage sensitive components.

Figure 9:
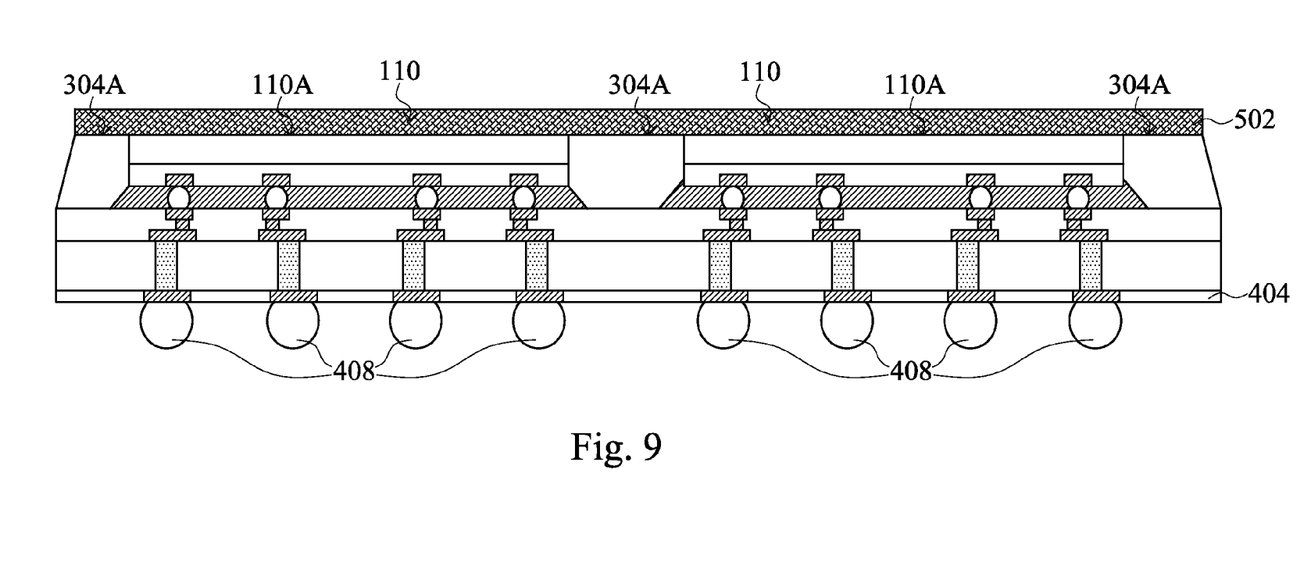
Figure 10:
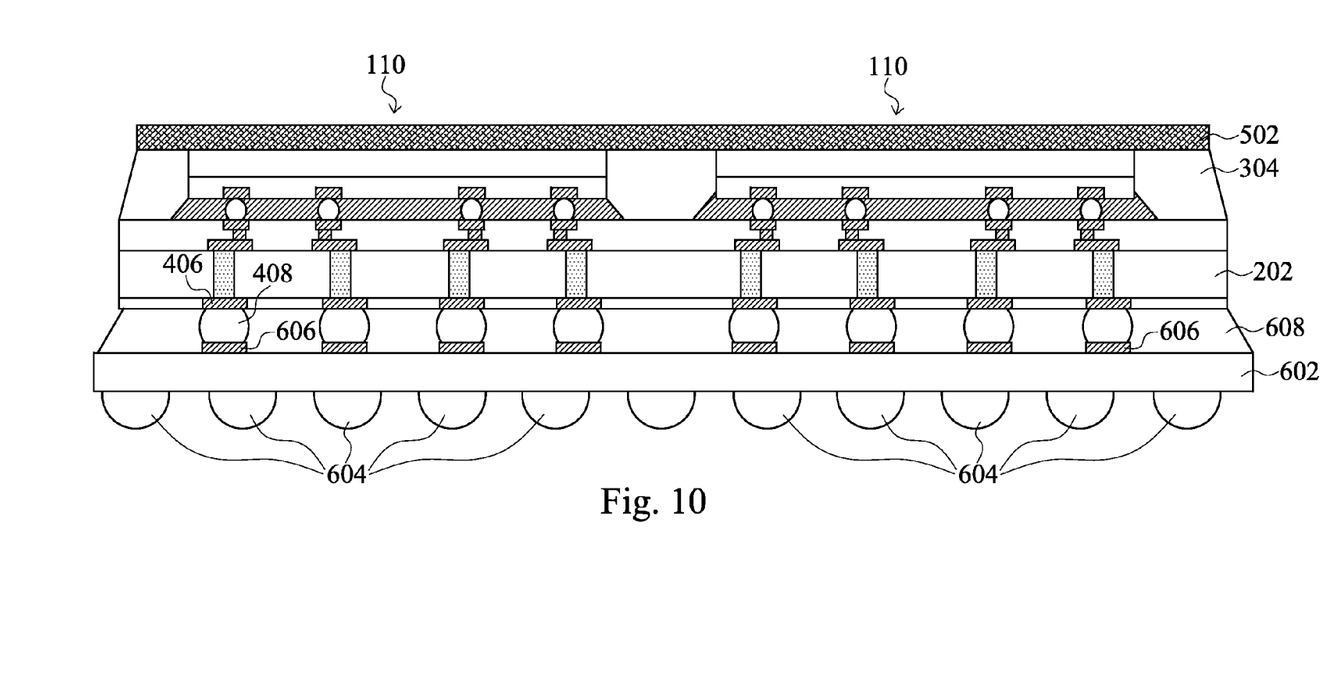
Figure 11:
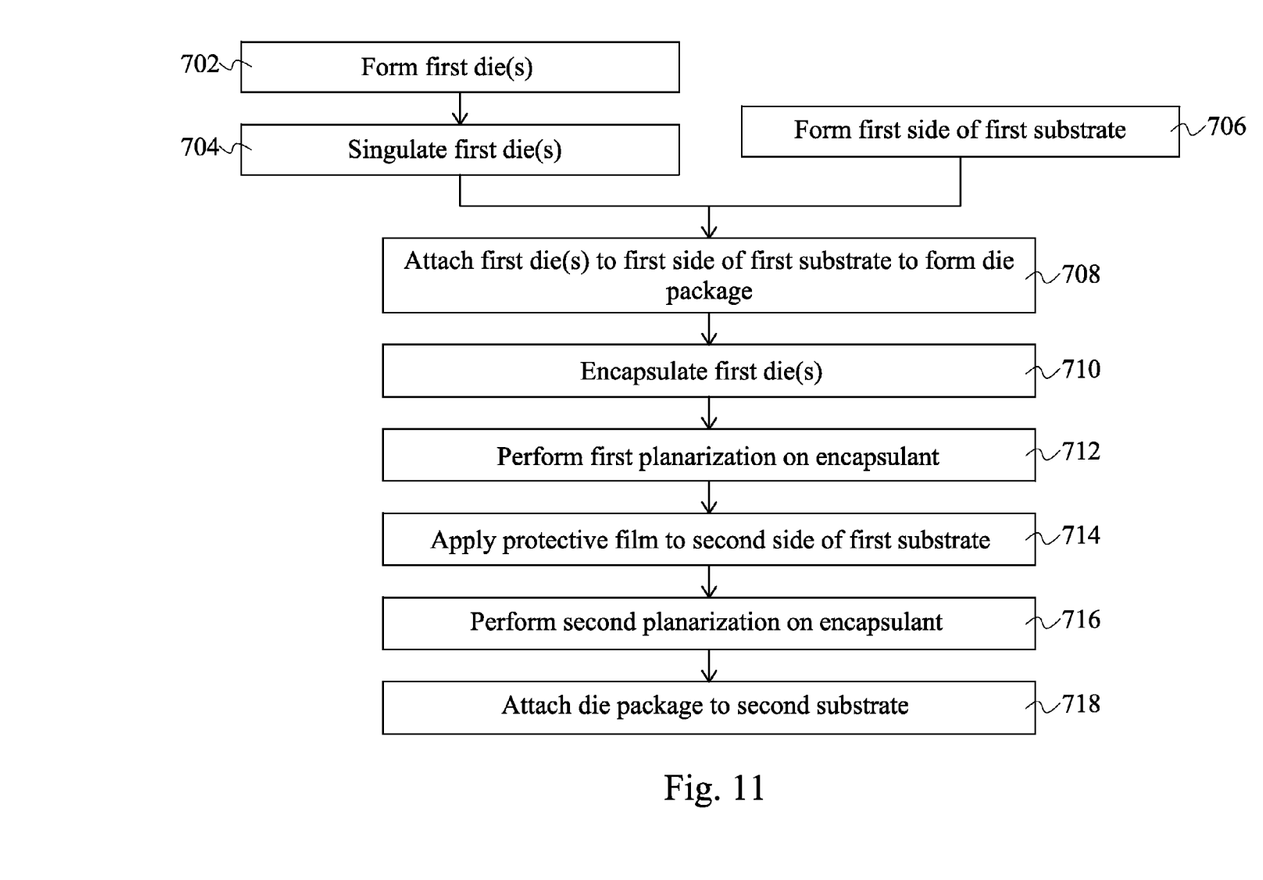
FIG. 11 is a flow chart of the process of forming a package in accordance with some embodiments.

FIGS. 1 through 10 illustrate cross-sectional views of intermediate steps in forming a package in accordance with some embodiments, and FIG. 11 is a flow chart of the process illustrated in FIGS. 1 through 10 in accordance with some embodiments.

Figure 1:
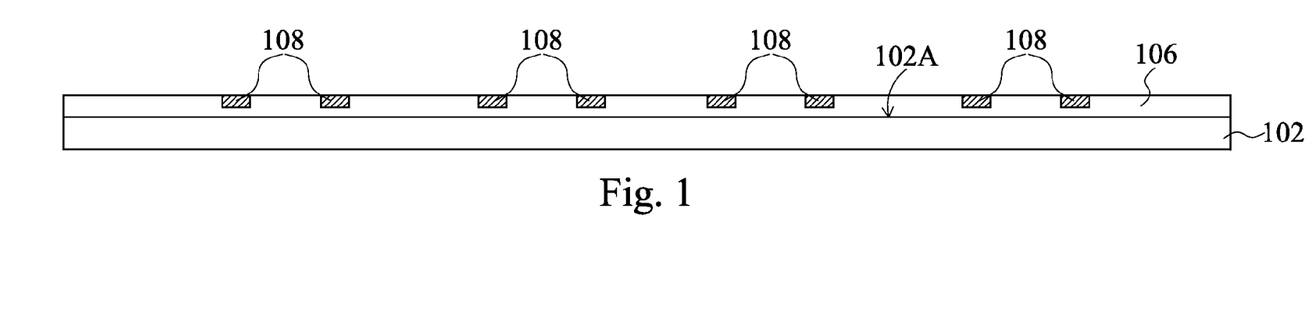
FIGS. 1 through 10 illustrate cross-sectional views of intermediate steps in forming a package in accordance with some embodiments.

FIG. 1 illustrates the formation of one or more dies 110 (step 702). A substrate 102 comprises one or more dies 110 during processing. The substrate 102 includes an interconnect structure 106 over an active surface 102A with bond pads 108 formed in and/or on the interconnect structure 106.

The substrate 102 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 102 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof.

The substrate 102 may include active and passive devices (not shown in FIG. 1). As one of ordinary skill in the art will recognize, a wide variety of devices such as transistors, capacitors, resistors, combinations of these, and the like may be used to generate the structural and functional requirements of the design for the one or more dies 110. The devices may be formed using any suitable methods.

An interconnect structure 106 comprising one or more dielectric layer(s) and respective metallization pattern(s) is formed on the active surface 202A. The metallization pattern(s) in the dielectric layer(s) may route electrical signals between the devices, such as by using vias and/or traces, and may also contain various electrical devices, such as capacitors, resistors, inductors, or the like. The various devices and metallization patterns may be interconnected to perform one or more functions. The functions may include memory structures, processing structures, sensors, amplifiers, power distribution, input/output circuitry, or the like.

One or more inter-metallization dielectric (IMD) layers formed in the interconnect structure 208 may be formed, for example, of a low-K dielectric material, such as phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or the like, by any suitable method known in the art, such as spinning, chemical vapor deposition (CVD), plasma-enhanced CVD (PECVD), high-density plasma chemical vapor deposition (HDP-CVD), or the like. A metallization pattern may be formed in the IMD layer, for example, by using photolithography techniques to deposit and pattern a photoresist material on the IMD layer to expose portions of the IMD layer that are to become the metallization pattern. An etch process, such as an anisotropic dry etch process, may be used to create recesses and/or openings in the IMD layer corresponding to the exposed portions of the IMD layer. The recesses and/or openings may be lined with a diffusion barrier layer and filled with a conductive material. The diffusion barrier layer may comprise one or more layers of TaN, Ta, TiN, Ti, CoW, or the like, deposited by atomic layer deposition (ALD), or the like, and the conductive material may comprise copper, aluminum, tungsten, silver, and combinations thereof, or the like, deposited by chemical vapor deposition (CVD), physical vapor deposition (PVD), or the like. Any excessive diffusion barrier layer and/or conductive material on the IMD layer may be removed, such as by using a chemical mechanical polish (CMP).

The bond pads 108 are formed in and/or on the interconnect structure 106. In some embodiments, the bond pads 108 are formed by forming recesses (not shown) into one or more of the dielectric layers of the interconnect structure 106. The recesses may be formed to allow the bond pads 108 to be embedded into the interconnect structure 106. In other embodiments, the recesses are omitted as the bond pads 108 are formed on the interconnect structure 106. The bond pads 108 electrically and/or physically couple the one or more dies 110 to the subsequently bonded substrate 202 (see FIG. 4). In some embodiments, the bond pads 108 include a thin seed layer (not shown) made of copper, titanium, nickel, gold, the like, or a combination thereof. The conductive material of the bond pads 108 may be deposited over the thin seed layer. The conductive material may be formed by an electro-chemical plating process, CVD, ALD, PVD, the like, or a combination thereof. In an embodiment, the conductive material of the bond pads 108 is copper, tungsten, aluminum, silver, gold, the like, or a combination thereof.

In an embodiment, the bond pads 108 are underbump metallizations (UBMs) that include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 108. Any suitable materials or layers of material that may be used for the UBMs 108 are fully intended to be included within the scope of the current application.

Figure 2:
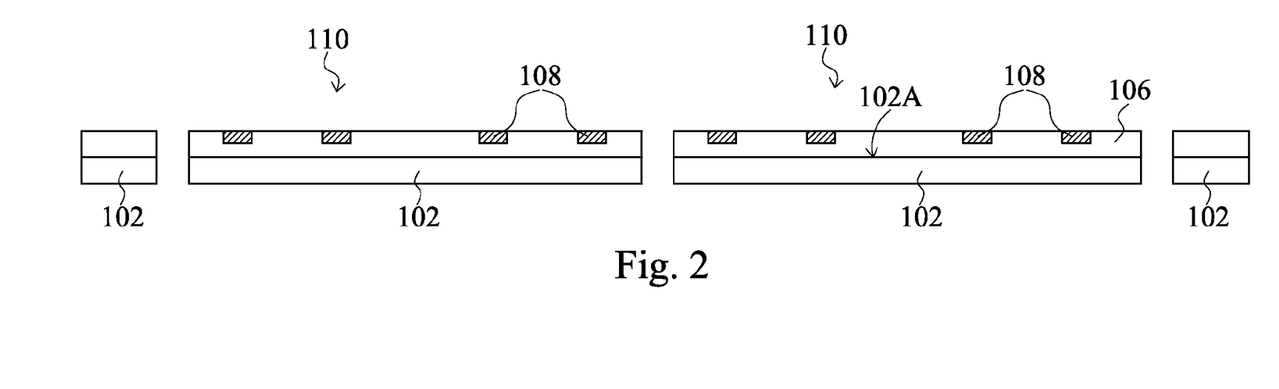

In FIG. 2, the substrate 102 including the interconnect structure 106 is singulated into individual dies 110 (step 704). Typically, the dies 110 contain the same circuitry, such as devices and metallization patterns, although the dies may have different circuitry. In some embodiments, the singulation is by sawing, laser, dicing, the like, or a combination thereof.

Figure 3:
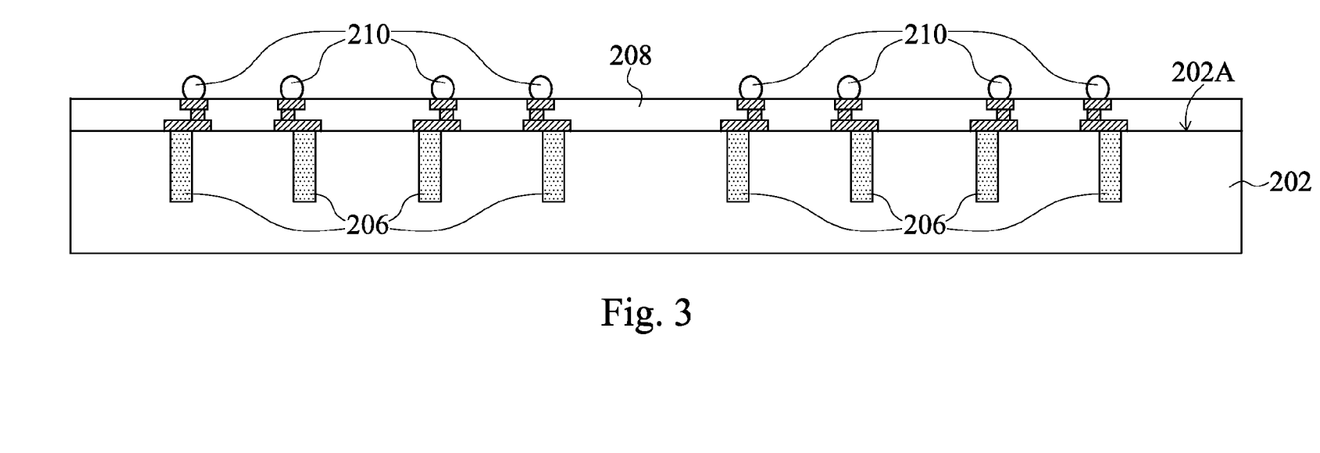

FIG. 3 illustrates the formation of a first side of a substrate 202 (step 706). The substrate 202 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 202 may be a SOI substrate. Generally, an SOI substrate includes a layer of a semiconductor material such as epitaxial silicon, germanium, silicon germanium, SOI, SGOI, or combinations thereof. The substrate 202 is, in one alternative embodiment, based on an insulating core such as a fiberglass reinforced resin core. One example core material is fiberglass resin such as FR4. Alternatives for the core material include bismaleimide-triazine (BT) resin, or alternatively, other PC board materials or films. Build up films such as Ajinomoto build-up film (ABF) or other laminates may be used for substrate 202.

The substrate 202 may include active and passive devices (not shown in FIG. 3) formed in and/or on a first surface 202A of the substrate 202. As one of ordinary skill in the art will recognize, a wide variety of devices such as transistors, capacitors, resistors, combinations of these, and the like may be used to generate the structural and functional requirements of the design for the substrate 202. The devices may be formed using any suitable methods. In some embodiments, the substrate 202 is an interposer that generally does not include active devices therein, although the interposer may include passive devices formed in and/or on a first surface 202A.

Through-vias (TVs) 206 are formed to extend from the first surface 202A of the substrate 202 into the substrate 202. The TVs 206 are also sometimes referred to as through-substrate vias or through-silicon vias when the substrate 202 is a silicon substrate. The TVs 206 may be formed by forming recesses in the substrate 202 by, for example, etching, milling, laser techniques, the like, or a combination thereof. A thin barrier layer may be conformally deposited over the front side of the substrate 202 and in the openings, such as by CVD, ALD, PVD, thermal oxidation, the like, or a combination thereof. The barrier layer may comprise a nitride or an oxynitride, such as titanium nitride, titanium oxynitride, tantalum nitride, tantalum oxynitride, tungsten nitride, the like, or a combination thereof. A conductive material may be deposited over the thin barrier layer and in the openings. The conductive material may be formed by an electro-chemical plating process, CVD, ALD, PVD, the like, or a combination thereof. Examples of conductive materials are copper, tungsten, aluminum, silver, gold, the like, or a combination thereof. Excess conductive material and barrier layer is removed from the front side of the substrate 202 by, for example, a CMP. Thus, the TVs 206 may comprise a conductive material and a thin barrier layer between the conductive material and the substrate 202.

An interconnect structure 208 is formed over the first surface 202A of the substrate 202, and is used to electrically connect the integrated circuit devices, if any, and/or the TVs 206 together and/or to external devices. The interconnect structure 208 may include one or more dielectric layer(s) and respective metallization pattern(s) in the dielectric layer(s). The metallization patterns may comprise vias and/or traces to interconnect any devices and/or TVs 206 together and/or to an external device. The metallization patterns are sometimes referred to as Redistribution Lines (RDLs). The dielectric layers may comprise silicon oxide, silicon nitride, silicon carbide, silicon oxynitride, low-K dielectric material, such as PSG, BPSG, FSG, SiOxCy, Spin-On-Glass, Spin-On-Polymers, silicon carbon material, compounds thereof, composites thereof, combinations thereof, or the like. The dielectric layers may be deposited by any suitable method known in the art, such as spinning, CVD, PECVD, HDP-CVD, or the like. A metallization pattern may be formed in the dielectric layer, for example, by using photolithography techniques to deposit and pattern a photoresist material on the dielectric layer to expose portions of the dielectric layer that are to become the metallization pattern. An etch process, such as an anisotropic dry etch process, may be used to create recesses and/or openings in the dielectric layer corresponding to the exposed portions of the dielectric layer. The recesses and/or openings may be lined with a diffusion barrier layer and filled with a conductive material. The diffusion barrier layer may comprise one or more layers of TaN, Ta, TiN, Ti, CoW, or the like, deposited by ALD, or the like, and the conductive material may comprise copper, aluminum, tungsten, silver, and combinations thereof, or the like, deposited by CVD, PVC, or the like. Any excessive diffusion barrier layer and/or conductive material on the dielectric layer may be removed, such as by using a CMP.

Electrical connectors 210 are formed at the top surface of and electrically coupled to the interconnect structure 208. The electrical connectors 210 may be solder balls, metal pillars, controlled collapse chip connection (C4) bumps, micro bumps, electroless nickel-electroless palladium-immersion gold technique (ENEPIG) formed bumps, or the like. The electrical connectors 210 may include a conductive material such as solder, copper, aluminum, gold, nickel, silver, palladium, tin, the like, or a combination thereof. In an embodiment in which the electrical connectors 210 are solder bumps, the electrical connectors 210 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the electrical connectors 210 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 210. The metal cap layer may include nickel, tin, tin-lead, gold, silver, palladium, indium, nickel-palladium-gold, nickel-gold, the like, or a combination thereof and may be formed by a plating process.

Figure 4:
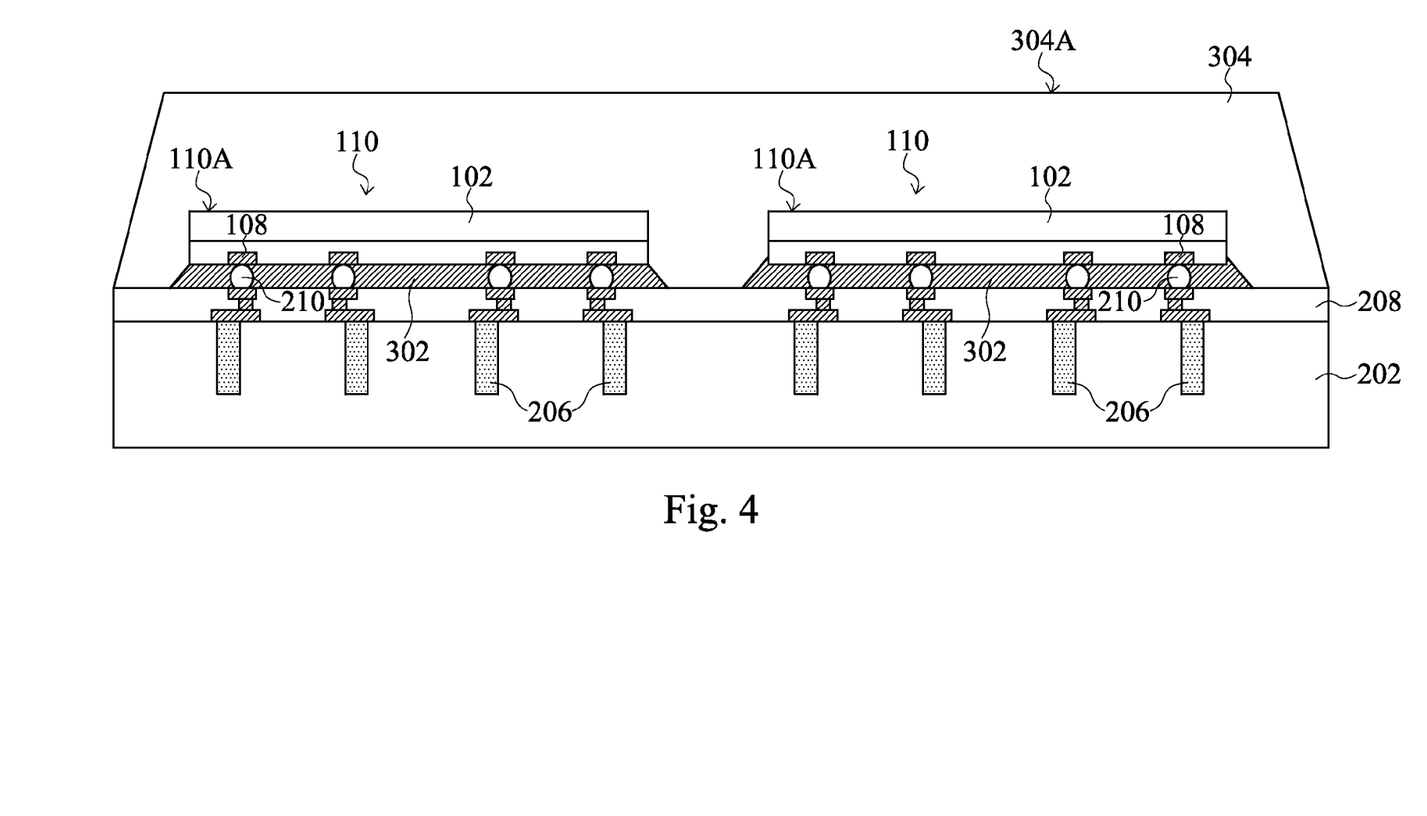

FIG. 4 illustrates attaching the dies 110 to the first side of the first substrate (step 708), for example, through flip-chip bonding to form a die package. The electrical connectors 210 electrically couple the circuits in the dies 110 to the interconnect structure 208 and TVs 206.

The dies 110 may include a logic die, such as a central processing unit (CPU), a graphics processing unit (GPU), the like, or a combination thereof. In some embodiments, the dies 110 include a die stack (not shown) which may include both logic dies and memory dies. The dies 110 may include an input/output (I/O) die, such as a wide I/O die.

The bonding between the dies 110 and the interconnect structure 208 may be a solder bonding or a direct metal-to-metal (such as a copper-to-copper or tin-to-tin) bonding. In an embodiment, the dies 110 are bonded to the interconnect structure 208 by a reflow process. During this reflow process, the electrical connectors 210 are in contact with the bond pads 108 and the interconnect structure 208 to physically and electrically couple the dies 110 to the interconnect structure 208.

An underfill material 302 may be injected or otherwise formed in the space between the dies 110 and the interconnect structure 208 and surrounding the electrical connectors 210. The underfill material 302 may, for example, be a liquid epoxy, deformable gel, silicon rubber, or the like, that is dispensed between the structures, and then cured to harden. This underfill material is used, among other things, to reduce damage to and to protect the electrical connectors 210.

After the dies 110 are attached to the substrate 202, the dies 110 are encapsulated (step 710). In some embodiments, the dies 110 are encapsulated by a molding material 304. The molding material 304 may be molded on the dies 110, for example, using compression molding. In some embodiments, the molding material 304 is made of a molding compound, a polymer, an epoxy, silicon oxide filler material, the like, or a combination thereof. A curing step may be performed to cure the molding material 304, wherein the curing may be a thermal curing, a Ultra-Violet (UV) curing, the like, or a combination thereof.

Figure 5:
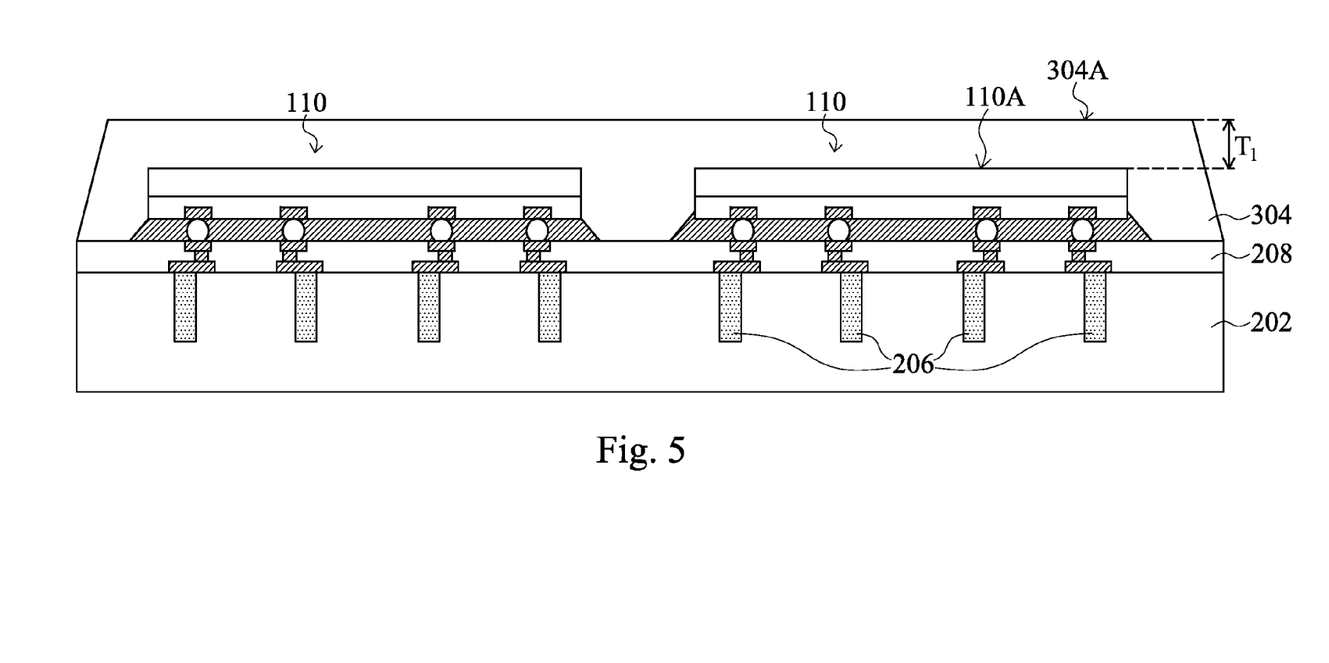

In some embodiments, the dies 110 are buried in the molding material 304, and after the curing of the molding material 304, a first planarization process is performed on the molding material 304 (step 712) as illustrated in FIG. 5. In an embodiment, the first planarization process is a grinding process, although other techniques including etching, laser ablation, polishing, and the like could be employed. The first planarization process is used planarize the molding material 304 to provide a substantially planar top surface 304A of the molding material 304. The first planarization process removes some, but not all, of molding material 304 over the dies 110 such that backside surfaces 110A of the dies 110 are still buried in molding material 304. In an embodiment, the remaining amount of molding material 304 over the backside surfaces 110A of the dies 110 has a thickness $T_1$ of greater than about 30 µm, such as from about 30 µm to about 50 µm.

The thickness $T_1$ is a sufficient thickness of molding material 304 to block the electro-static discharge path between the dies 110 and the carrier substrate 402 and also to allow a possible rework of the molding compound 304 without exposing the dies 110. For example, after the first planarization process, a defect could be found on the molding compound 304 and a rework process, e.g. a grinding process, may need to be performed to remove the defect. By having at least 30 µm of molding compound 304 over the backside surfaces 110A of the dies 110, the backside surfaces 110A of the dies 110 will not be exposed during the rework process, and hence, they will remain protected by the molding compound 304.

Figure 6:
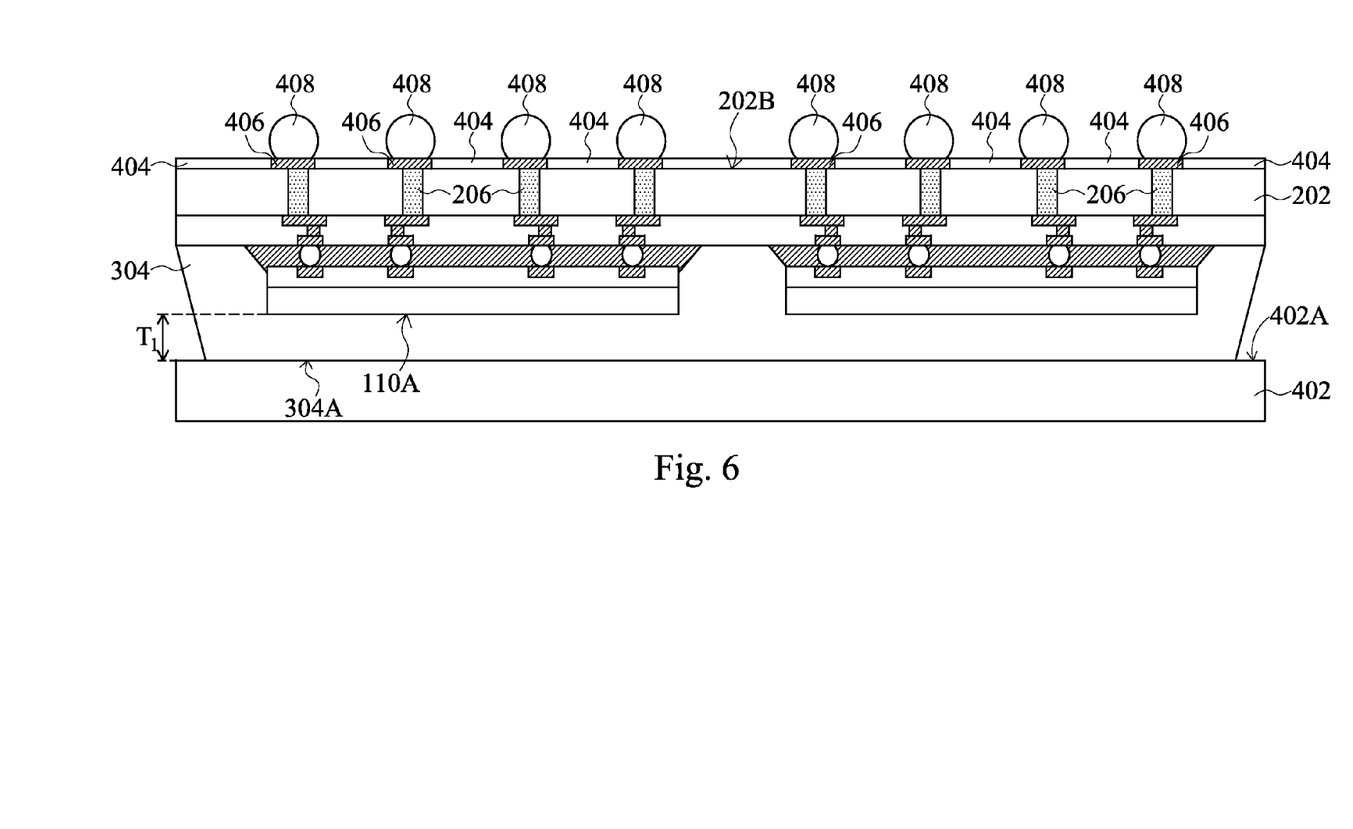

FIG. 6 illustrates flipping over the die package and adhering the surface 304A of the molding material 304 to a carrier substrate 402 to allow formation of the formation of a second side of the substrate 202. The carrier substrate 402 may be any suitable substrate that provides (during intermediary operations of the fabrication process) mechanical support for the components and structures over the carrier substrate 402. The carrier substrate 402 may be a wafer including glass, quartz, silicon (e.g., a silicon wafer), silicon oxide, a metal plate, a ceramic material, or the like.

In the formation of the second side, a thinning process is performed on the second side of the substrate 202 to thin the substrate 202 to a second surface 202B until the TVs 206 are exposed. In an embodiment, the thinning process is a grinding process, although other techniques including etching, laser ablation, polishing, and the like could be employed. A dielectric layer(s) 404 is formed on the second surface 202B of the substrate 202. A metallization pattern(s) 406 may be formed on the second surface 202B and in dielectric layer(s) 404, using similar processes as discussed above.

Electrical connectors 408 are also formed on the second side of substrate 202 and are electrically coupled to the TVs 206. In some embodiments, the electrical connectors 408 are solder balls, metal pillars, C4 bumps, micro bumps, ENEPIG formed bumps, or the like. The electrical connectors 408 may include a conductive material such as solder, copper, aluminum, gold, nickel, silver, palladium, tin, the like, or a combination thereof. In another embodiment, the electrical connectors 408 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 408. The metal cap layer may include nickel, tin, tin-lead, gold, silver, palladium, indium, nickel-palladium-gold, nickel-gold, the like, or a combination thereof and may be formed by a plating process. The electrical connectors 408 may be used to bond to an additional electrical component, which may be a semiconductor substrate, a package substrate, a Printed Circuit Board (PCB), or the like.

During the formation of the second side of the substrate 202 (e.g. formation of the dielectric layer(s) 404, metallization patterns(s) 406, and/or electrical connectors 408), the dies 110, the substrate 202, and the electrical connectors 408 can become positively charged, while the carrier substrate 402 can become negatively charged, or vice versa. Hence, the interface between the dies 110 and the carrier substrate 402 can be an electro-static discharge path. The discharging of this electro-static energy can damage devices in and/or on the dies 110 and the substrate 202. By leaving an amount of the molding material 304 covering the backside surfaces 110A of the dies 110, the molding material 304 forms an isolation layer, which blocks the electro-static discharge path between the dies 110 and the carrier substrate 402. The carrier substrate 402 and the backside surfaces 110A of the dies 110 are separated by molding material 304 having the thickness $T_1$, which is a sufficient thickness of molding material 304 to block the electro-static discharge path between the dies 110 and the carrier substrate 402.

Figure 7:
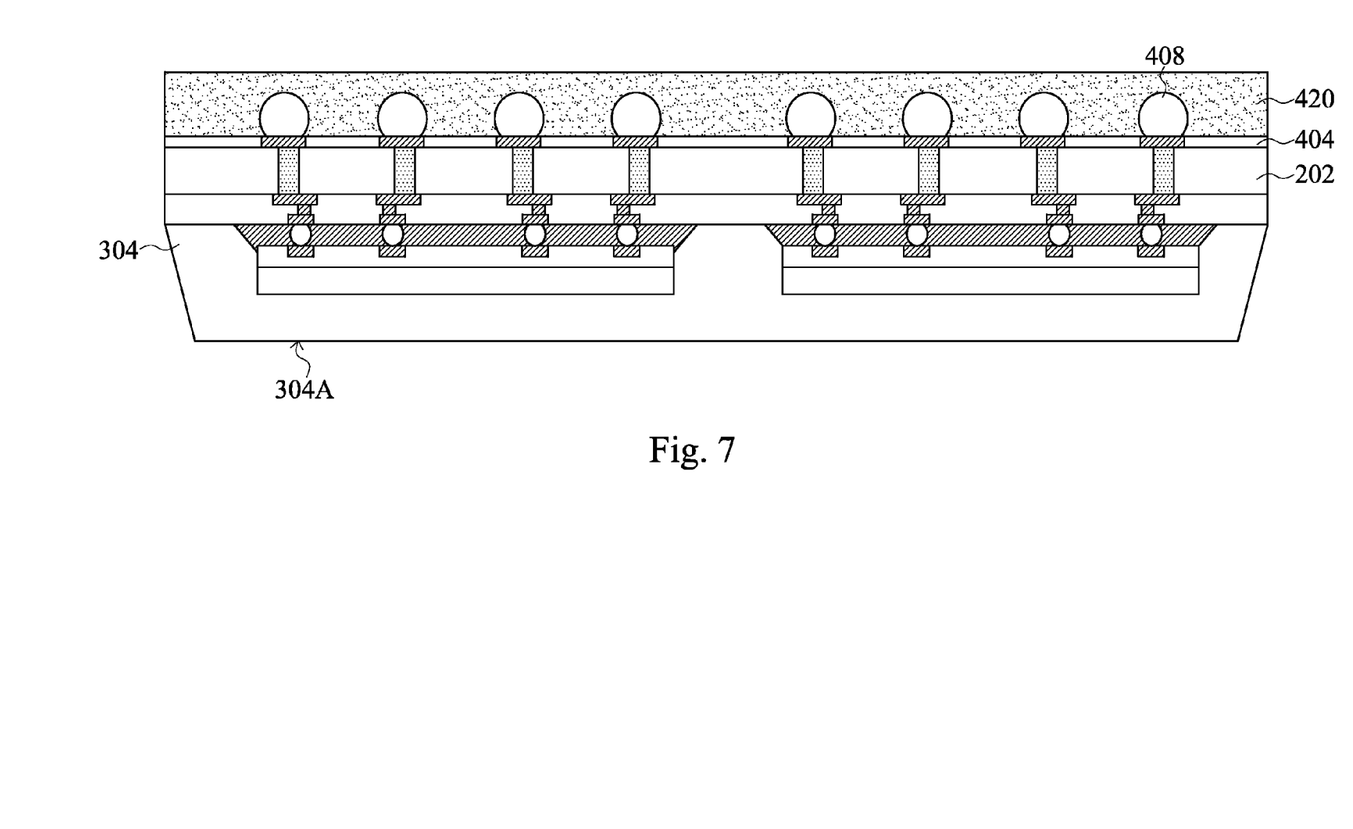

FIG. 7 illustrates applying a protection film 420 to the second side of the substrate 202 (step 714) and removing the carrier substrate 402. The protection film 420 may be a tape, such as a backgrinding (BG) tape (UV or non-UV type), which may be used to protect the second side of the substrate 202 from grinding debris during a subsequent molding material planarization process (see FIG. 8). The protective film 420 may be applied over the second side of the substrate 202 using, for example, a roller (not shown). The protective film 420 may have a sufficient thickness to fully cover the electrical connectors 408 as illustrated in FIG. 7.

Figure 8:
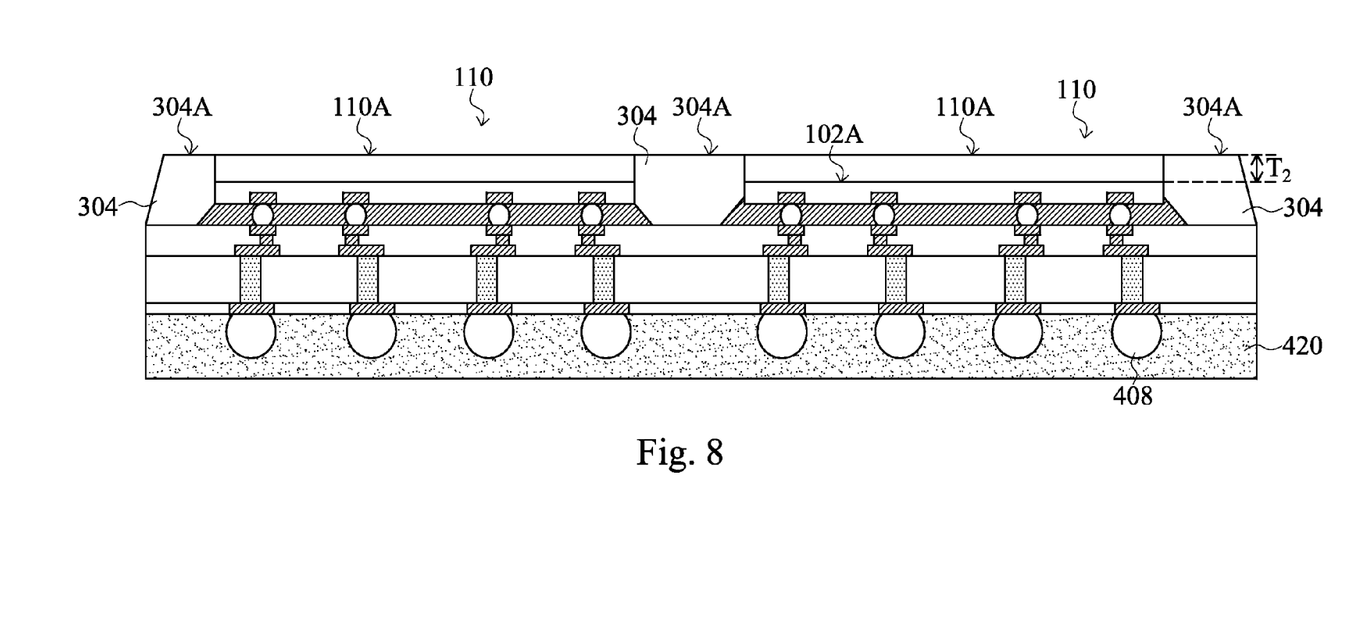

FIG. 8 illustrates performing a second planarization process to the molding material 304 (step 716). In an embodiment, the second planarization process is a grinding process, although other techniques including etching, laser ablation, polishing, and the like could be employed. The second planarization process is used to remove excess portions of the molding material 304, which excess portions are over backside surfaces 110A of the dies 110. In some embodiments, the backside surfaces 110A of the dies 110 are exposed, and are level with the surface 304A of the molding material 304.

In some embodiments, after the second planarization process, the dies 110 can have a thickness from the active surface 102A to the backside surface 110A of about 2.2 µm, as compared to a die not using the above-described two-step molding material planarization process, which typically has a thickness of about 1.05 µm. Another aspect of embodiments of the present disclosure is a difference in the roughness of the surface 304A of the molding material 304 when the above-described processes are employed. For instance, in some embodiments, a roughness of about 1 to about 3 µm was observed, relative to a roughness of about 0 to about 1 µm when the process is not employed. The differences of the thickness of the dies 110 and the surface roughness of the molding material 304 are at least partially attributed to performing the second molding material planarization process (see step 716 above) while the protective film 420 is on the opposite side of the die package (e.g. over the second side of the substrate 202), because the protective film 420 is softer than the substrate 202, which is on the opposite side of the die package during the first molding material planarization process (see step 712 above). Hence, the softer protective film 420 can compress and absorb some of the pressure being applied during the second molding material planarization process, which can cause the second molding material process to consume less of the backside surface 110A of the dies 110 and can also increase the roughness of the surface 304A of the molding material 304.

FIG. 9 illustrates removing the protective film 420 and attaching an optional heat sink 502 to the backside surfaces 110A of the dies 110 and the surface 304A of the molding material 304. The heat sink 502 can adhered to the dies 110 and the molding material 304 by an adhesive film (not shown). The adhesive film may be applied to the heat sink 502 or to the backside surfaces 110A of the dies 110 and the surface 304A of the molding material 304 to have a thickness such that it is not so thick as to suppress thermal dissipation. The adhesive film may be an epoxy, resin, the like, or a combination thereof. The heat sink 502 may be a metal plate. Exemplary materials for the metal plate are copper, nickel-plated copper, aluminum, the like, or a combination thereof. The heat sink 502 generally may have good thermal conductivity and/or have a coefficient of thermal expansion (CTE) comparable to the CTE of the dies 110. The heat sink 502 typically dissipates heat when in the completed package.

FIG. 10 illustrates attaching the die package to a substrate 602 (step 718). The substrate 602 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 602 may be a SOI substrate. Generally, an SOI substrate includes a layer of a semiconductor material such as epitaxial silicon, germanium, silicon germanium, SOI, SGOI, or combinations thereof. The substrate 602 is, in one alternative embodiment, based on an insulating core such as a fiberglass reinforced resin core. One example core material is fiberglass resin such as FR4. Alternatives for the core material include BT resin, or alternatively, other PC board materials or films. Build up films such as ABF or other laminates may be used for substrate 602.

The substrate 602 may include active and passive devices (not shown in FIG. 10). As one of ordinary skill in the art will recognize, a wide variety of devices such as transistors, capacitors, resistors, combinations of these, and the like may be used to generate the structural and functional requirements of the design for the substrate 602. The devices may be formed using any suitable methods. In some embodiments, the substrate 602 is package substrate.

The substrate 602 includes bond pads 606 on a first side of the substrate 602 and electrical connectors 604 on a second side of the substrate, the second side being opposite the first side. The bond pads 606 and the electrical connectors 604 may be similar to the bond pads 108 and the electrical connectors 408, respectively, described above and the descriptions are not repeated herein, although the bond pads 108 and 606 and the electrical connectors 408 and 604 need not be the same.

The bonding between the die package and the substrate 602 may be a solder bonding or a direct metal-to-metal (such as a copper-to-copper or tin-to-tin) bonding. In an embodiment, the die package is bonded to the substrate 602 by a reflow process. During this reflow process, the electrical connectors 408 are in contact with the metallization patterns 406 and bond pads 606 to physically and electrically couple the die package to the substrate 602.

An underfill material 608 may be injected or otherwise formed in the space between the die package and the substrate 602 and surrounding the electrical connectors 408. The underfill material 608 may, for example, be a liquid epoxy, deformable gel, silicon rubber, or the like, that is dispensed between the structures, and then cured to harden. This underfill material is used, among other things, to reduce damage to and to protect the electrical connectors 408.

By maintaining an isolation layer on a die (such as the backside of a die) during a bump formation process, the path by which static electricity can reach and damage sensitive components may be significantly reduced or eliminated altogether. As such, the process windows for manufacturing CoWoS devices can be expanded, reducing manufacturing costs and complexity, while increasing process yield.

For example, during the formation of a second side of a substrate (e.g. formation of dielectric layer(s), metallization patterns(s), and/or electrical connectors), the dies attached to the substrate, the substrate itself, and the electrical connectors can become positively charged, while a carrier substrate (attached to backside of dies) can become negatively charged, or vice versa. Hence, the interface between the dies 110 and the carrier substrate can be an electro-static discharge path. By leaving an amount of the molding material covering the backside surfaces of the dies, the molding material forms an isolation layer, which blocks the electro-static discharge path between the dies and carrier substrate.

An embodiment is a method including mounting a die to a top surface of a substrate to form a device, encapsulating the die and top surface of the substrate in a mold compound, the mold compound having a first thickness over the die, and removing a portion, but not all, of the thickness of the mold compound over the die. The method further includes performing further processing on the device, and removing the remaining thickness of the mold compound over the die.

Another embodiment is a method including attaching an active surface of a first die to a first side of a first substrate to form a die package, encapsulating the first die and the first side of the substrate with a molding material, the molding material having a first thickness from a first surface of the molding material to a backside surface of the first die, the backside surface being opposite the active surface, and performing a first planarizing step to the first surface of the molding material to have a second thickness from the first surface of the molding material to the backside surface of the first die, the second thickness being less than the first thickness. The method further includes attaching the first surface of the molding material to a carrier substrate, forming an electrical connector over a second side of the first substrate, removing the carrier substrate, and performing a second planarizing step to the first surface of the molding material to remove the remaining molding material over the backside surface of the first die.

A further embodiment is a method including attaching a die to a first surface of a first substrate to form a device package, encapsulating the die and the first surface of the first substrate with a molding compound, the molding compound extending over the die, and removing a portion of the molding compound extending over the die. The method further includes performing further processing on the device package, and removing the remaining portion of the molding compound over the die to expose a surface of the die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
mounting a die to a top surface of a substrate to form a device;
encapsulating the die and top surface of the substrate in a molding compound, the molding compound having a first thickness over the die;
removing a portion, but not all, of the first thickness of the molding compound over the die to leave a remaining thickness of molding compound over the die, the remaining thickness of the molding compound being substantially uniform over the die;
performing further processing on the device; and
removing the remaining thickness of the molding compound over the die.

2. The method of claim 1, wherein the further processing comprises forming an electrical connector on a bottom surface of the substrate.

3. The method of claim 2, wherein the electrical connector is a controlled collapse chip connection.

4. The method of claim 1, wherein the further processing comprises grinding back a bottom surface of the substrate and forming an electrical connector on the ground back surface.

5. The method of claim 1, further comprising mounting the device to a second substrate.

6. The method of claim 5, wherein the second substrate is a printed circuit board.

7. The method of claim 1, wherein the remaining thickness of molding compound is greater than 30 μm.

8. The method of claim 1 further comprising:
after the removing the remaining thickness of the molding compound over the die, adhering a heat sink to the die and the molding compound.

9. The method of claim 1, wherein after the removing the remaining thickness of the molding compound over the die, the die and the molding compound having surfaces which are substantially coplanar, the surfaces being distal the substrate.

10. A method comprising:
attaching an active surface of a first die to a first side of a first substrate to form a die package;
encapsulating the first die and the first side of the first substrate with a molding material, the molding material having a first thickness from a first surface of the molding material to a backside surface of the first die, the backside surface being opposite the active surface;

performing a first planarizing step to the first surface of the molding material to have a second thickness from the first surface of the molding material to the backside surface of the first die, the second thickness being less than the first thickness;

attaching the first surface of the molding material to a carrier substrate;

forming an electrical connector over a second side of the first substrate;

removing the carrier substrate; and performing a second planarizing step to the first surface of the molding material to remove the remaining molding material over the backside surface of the first die.

11. The method of claim 10 further comprising:

forming a first through via extending from the first side of the first substrate into the first substrate, the first die being electrically coupled to a first end of the first through via and the electrical connector being coupled to a second end of the through via.

12. The method of claim 10 further comprising:

before performing the second planarizing step to the first surface of the molding material, forming a protective film over the electrical connector and over the second side of the first substrate.

13. The method of claim 12, wherein the protective film is a backgrinding tape.

14. The method of claim 10 further comprising:

mounting the die package to a second substrate using the electrical connector.

15. The method of claim 10 further comprising:

forming an underfill between the active surface of the first die and the first side of the first substrate, a sidewall of the underfill directly adjoining the molding material.

16. The method of claim 10, wherein after the performing the second planarizing step to the first surface of the molding material, the first surface of the molding material and the backside surface of the first die are substantially coplanar.

17. The method of claim 10 further comprising attaching an active surface of a second die to the first side of the first substrate to form the die package, the second die laterally adjacent the first die, wherein after performing the second planarizing step to the first surface of the molding material, a portion of the molding material remains between the first die and the second die.

18. A method comprising:

attaching a die to a first surface of a first substrate to form a device package;

encapsulating the die and the first surface of the first substrate with a molding compound, the molding compound extending over the die;

removing a portion of the molding compound extending over the die to leave a remaining portion of the molding compound extending over the die, a surface of the remaining portion of the molding compound being substantially planar;

performing further processing on the device package; and removing the remaining portion of the molding compound over the die to expose a surface of the die.

19. The method of claim 18, wherein the further processing comprises:

mounting the device package to a carrier substrate, the molding compound separating the carrier substrate from the die;

forming a conductive bump on a second surface of the first substrate, the second surface being opposite the first surface;

removing the carrier substrate; and applying a backgrinding tape over the conductive bump and the second surface of the first substrate, the backgrinding tape being over the conductive bump during the removing the remaining portion of the molding compound over the die to expose the surface of the die.

20. The method of claim 19 further comprising mounting the device package to a second substrate using the conductive bump.

* * * * *